(12) United States Patent
Takizawa

(10) Patent No.: US 9,704,814 B2
(45) Date of Patent: Jul. 11, 2017

(54) SEMICONDUCTOR DEVICE

(71) Applicant: FUJI ELECTRIC CO., LTD., Kawasaki-shi (JP)

(72) Inventor: Naoki Takizawa, Matsumoto (JP)

(73) Assignee: FUJI ELECTRIC CO., LTD., Kawasaki-shi (JP)

(*) Notice: Subject to any disclaimer, the term of this patent is extended or adjusted under 35 U.S.C. 154(b) by 0 days.

(21) Appl. No.: 15/149,581

(22) Filed: May 9, 2016

(65) Prior Publication Data

US 2016/0365320 A1 Dec. 15, 2016

(30) Foreign Application Priority Data

Jun. 10, 2015 (JP) .................. 2015-117264

(51) Int. Cl.
*H01L 23/00* (2006.01)
*H01L 23/498* (2006.01)
*H01L 23/373* (2006.01)
*H01L 29/16* (2006.01)
*H01L 29/872* (2006.01)
*H01L 25/07* (2006.01)
*H01L 23/36* (2006.01)

(52) U.S. Cl.
CPC ............ *H01L 23/562* (2013.01); *H01L 23/36* (2013.01); *H01L 23/3735* (2013.01); *H01L 25/072* (2013.01); *H01L 29/1608* (2013.01); *H01L 29/872* (2013.01)

(58) Field of Classification Search
CPC . H01L 23/562; H01L 29/1608; H01L 29/872; H01L 23/49844; H01L 25/072; H01L 23/49811; H01L 23/49822; H01L 23/3736; H01L 2924/13055; H01L 23/3735; H01L 2924/13091; H01L 2224/29005; H01L 2224/32225; H01L 2224/48227; H01L 2924/181; H01L 21/52; H01L 23/28; H01L 23/36; H01L 23/488; H01L 2924/3512
USPC ............................................................ 257/77
See application file for complete search history.

(56) References Cited

U.S. PATENT DOCUMENTS

| 2009/0229864 A1* | 9/2009 | Kuromitsu et al. H01L 23/3735 174/252 |
| 2012/0286292 A1 | 11/2012 | Nakayama et al. |
| 2014/0138707 A1 | 5/2014 | Miki et al. |

FOREIGN PATENT DOCUMENTS

| JP | 5147996 B2 | 12/2012 |
| WO | WO-2011/086896 A1 | 7/2011 |
| WO | WO-2013/008424 A1 | 1/2013 |

* cited by examiner

*Primary Examiner* — Caleen Sullivan
(74) *Attorney, Agent, or Firm* — Rabin & Berdo, P.C.

(57) ABSTRACT

A semiconductor device includes a cooling plate made of metal, one or more laminated substrates each formed by laminating a circuit board, an insulating board, and a metal board, and one or more first semiconductor elements each made of a wide-band-gap semiconductor and disposed over outer peripheral edge portions of the circuit board. The metal board and the cooling plate are joined by the use of a joining material. As a result, even if temperature rises due to the operation of the one or more first semiconductor elements and heat radiation is not performed properly, the one or more first semiconductor elements operate stably.

14 Claims, 4 Drawing Sheets

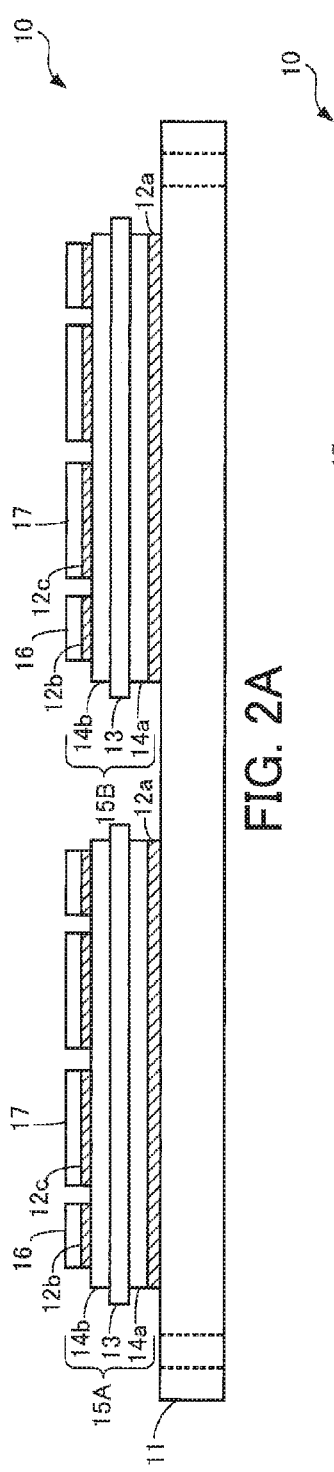
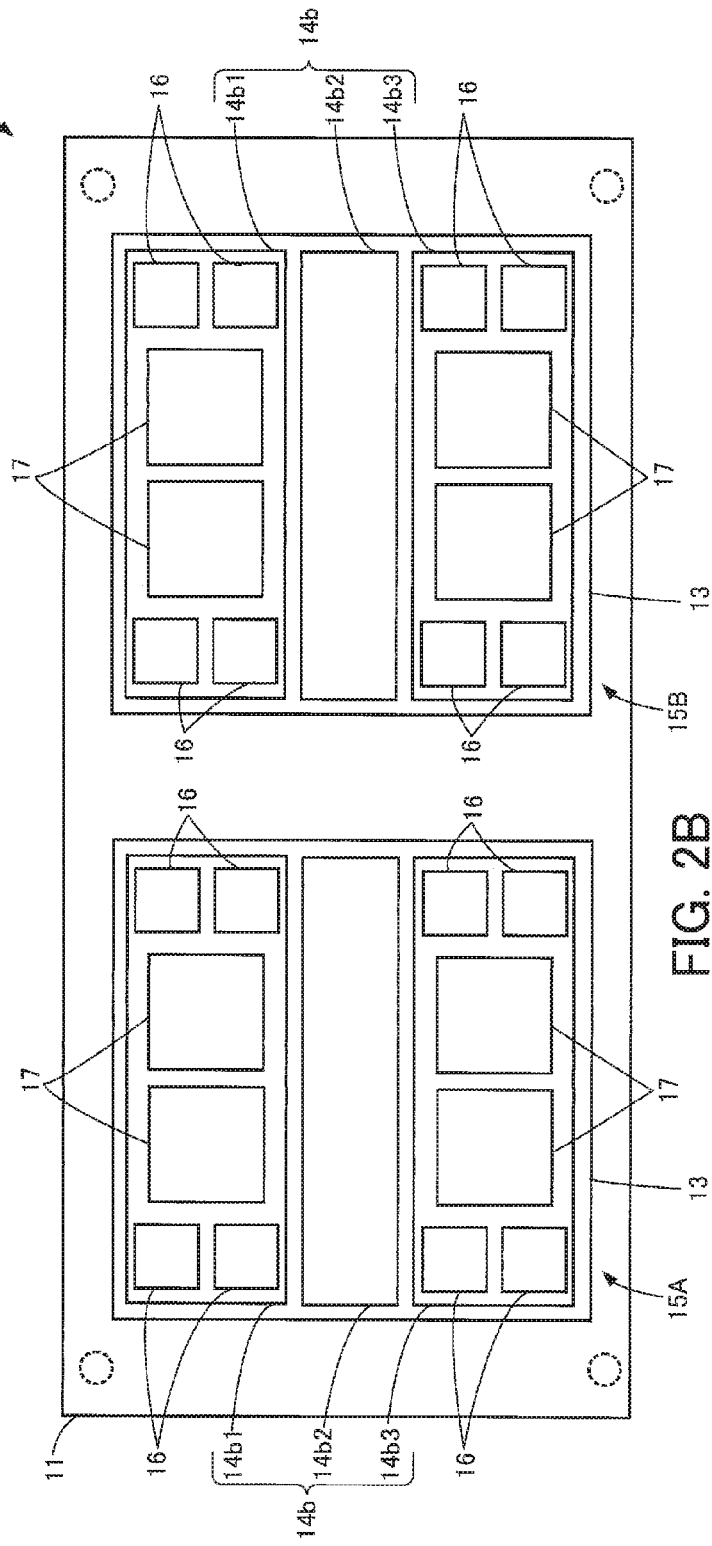
FIG. 2A
FIG. 2B

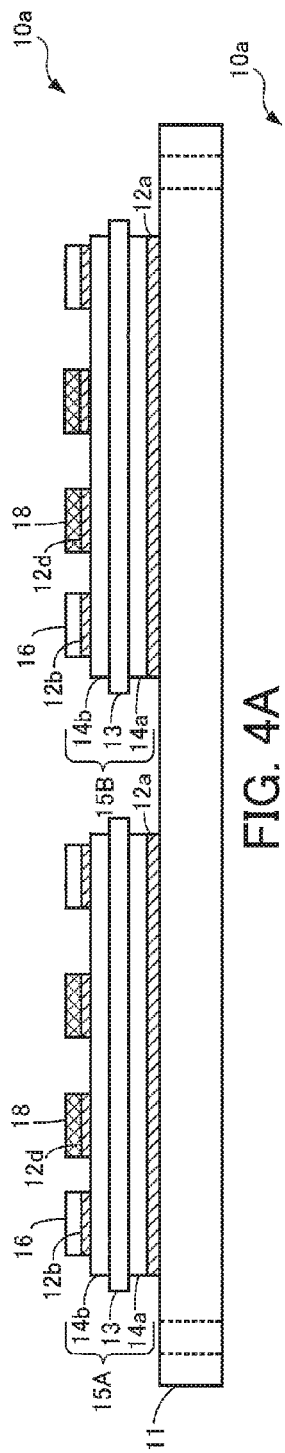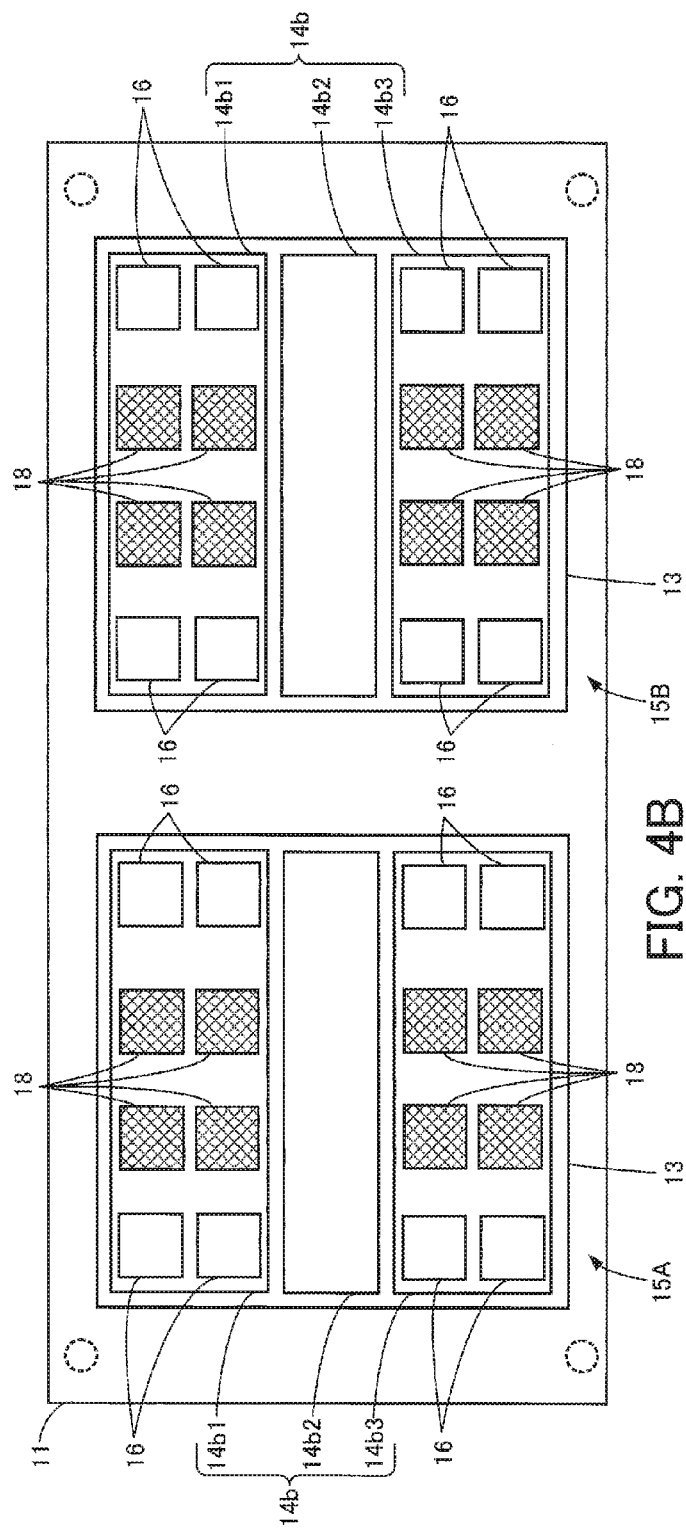
FIG. 4A
FIG. 4B

SEMICONDUCTOR DEVICE

CROSS-REFERENCE TO RELATED APPLICATION

This application is based upon and claims the benefit of priority of the prior Japanese Patent Application No. 2015-117264, filed on Jun. 10, 2015, the entire contents of which are incorporated herein by reference.

BACKGROUND OF THE INVENTION

1. Field of the Invention

The embodiments discussed herein are related to a semiconductor device.

2. Background of the Related Art

A power semiconductor module, which is a semiconductor device, includes a switching element made of silicon (Si) and a diode element made of a wide-band-gap semiconductor, such as silicon carbide (SiC), and is used as a power converter. With such a semiconductor device, a laminated substrate formed by laminating a circuit board, an insulating board, and a metal board is joined to a cooling plate made of metal by the use of solder. In addition, semiconductor elements, such as the above switching element or diode element, are disposed over the circuit board of the laminated substrate.

In this case, compared with the Si switching element, the SiC diode element is small in loss, operates stably at high temperatures, and has a high withstand voltage. The SiC diode element has these characteristics. Therefore, diode elements are disposed in a central area in the semiconductor device. In the central area in the semiconductor device, it is difficult to radiate heat, and therefore temperature tends to rise. Switching elements are disposed around the central area. This improves efficiency in the cooling of the semiconductor device (see, for example, Japanese Patent No. 5147996).

With the above semiconductor device (see, for example, Japanese Patent No. 5147996), cracks may appear in corner portions of the solder under the laminated substrate as a result of a heat cycle. When a heat cycle is repeated, the crack expands from each corner portion of the solder towards the center portion. Accordingly, the crack goes under a switching element made of silicon and disposed over a corner portion. Furthermore, the crack contains air. As a result, when heat is conducted from the switching element through the laminated substrate to the cooling plate, the crack in the solder degrades the heat radiation property. Compared with the SiC diode element, it is difficult for the Si switching element to operate stably at high temperatures. In this case, the heat radiation property of the Si switching element is degraded. This may lower the reliability of the semiconductor device.

SUMMARY OF THE INVENTION

According to an aspect, there is provided a semiconductor device including: a cooling plate made of metal; one or more laminated substrates each formed by laminating a circuit board, an insulating board, and a metal board, the metal board and the cooling plate being joined by using a joining material; and one or more first semiconductor elements each made of a wide-band-gap semiconductor and disposed over outer peripheral edge portions of the circuit board.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A and 2B illustrate a semiconductor device according to a second embodiment;

FIGS. 4A and 4B illustrate a semiconductor device according to a fourth embodiment.

DETAILED DESCRIPTION OF THE INVENTION

Figure 1A:
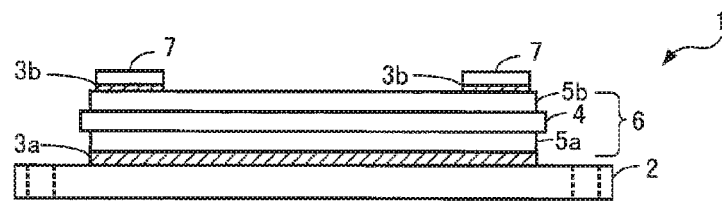
FIGS. 1A to 1C are views for describing a semiconductor device according to a first embodiment.

Embodiments will now be described with reference to the accompanying drawings, wherein like reference numerals refer to like elements throughout.

First Embodiment

Figure 1B:
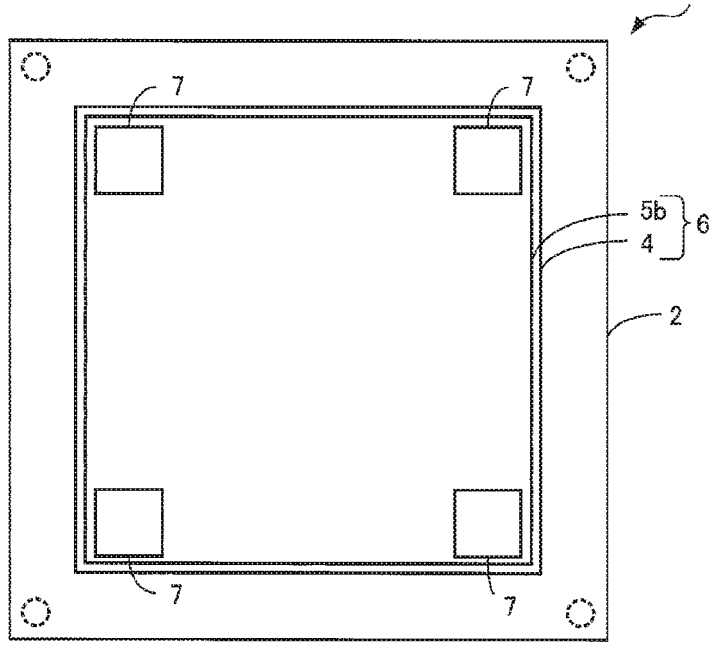
Figure 1C:
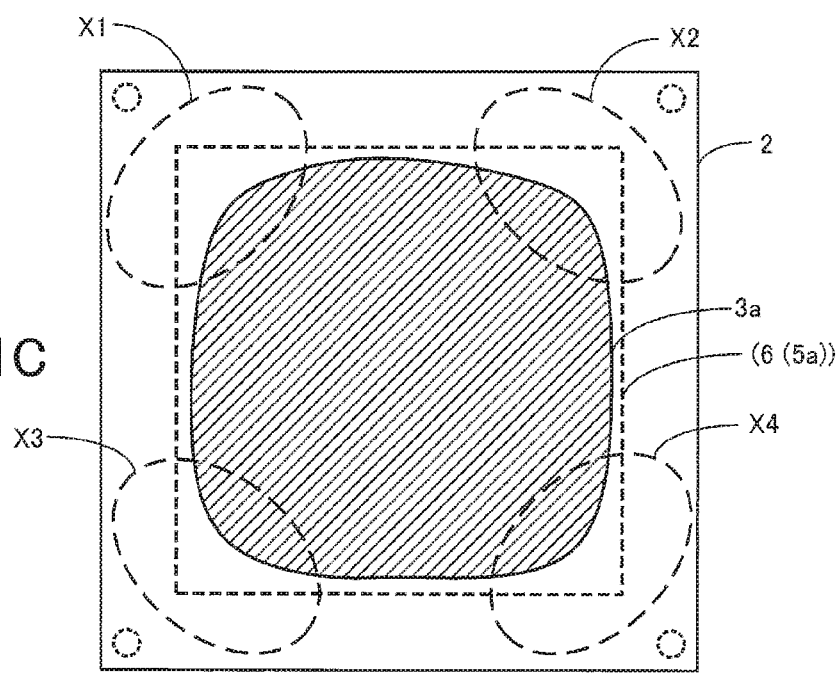

FIGS. 1A to 1C are views for describing a semiconductor device according to a first embodiment.

FIG. 1A is a side view of a semiconductor device 1. FIG. 1B is a top view of the semiconductor device 1. FIG. 1C is a top view which illustrates a situation where a crack appears in a joining material of the semiconductor device 1.

As illustrated in FIGS. 1A and 1B, the semiconductor device 1 includes a cooling plate 2, a laminated substrate 6, and one or more (four, in FIG. 1B) first semiconductor elements 7.

The cooling plate 2 is made of metal, such as copper or aluminum, having good thermal conductivity. A surface film, such as nickel (Ni) plating, may be formed on the cooling plate 2. The cooling plate 2 has the function of radiating, at the time of the operation of the semiconductor device 1, heat generated by a first semiconductor element 7 to the outside of the semiconductor device 1 to cool the semiconductor device 1.

The laminated substrate 6 is formed by laminating a circuit board 5b, an insulating board 4, and a metal board 5a. The insulating board 4 is made of, for example, a ceramic material, such as aluminum oxide ($Al_2O_3$), aluminum nitride (AlN), or silicon nitride ($Si_3N_4$), having relatively high thermal conductivity. In addition, the circuit board 5b and the metal board 5a are made of copper, aluminum, or the like. Furthermore, the laminated substrate 6 is joined to the cooling plate 2 with the metal board 5a therebetween by the use of a conductive joining material 3a, such as solder or a sintered metal material, having good thermal conductivity. A direct copper bonding (DCB) substrate, an active metal blazed (AMB) substrate, or the like may be used as the laminated substrate 6.

Each first semiconductor element 7 is made of a wide-band-gap semiconductor, such as silicon carbide (SiC) or gallium nitride (GaN), whose band gap is larger than that of silicon. Each first semiconductor element 7 is disposed over an outer peripheral edge portion of the circuit board 5b of the laminated substrate 6 and is joined to the circuit board 5b by the use of a conductive joining material 3b (FIG. 1B).

Compared with a semiconductor element made of a silicon semiconductor, usually each first semiconductor element 7 made of a wide-band-gap semiconductor is small in loss, operates stably at high temperatures, and has a high withstand voltage. Each first semiconductor element 7 has these characteristics.

A position over the laminated substrate 6 where each first semiconductor element 7 is disposed will now be described.

FIG. 1C illustrates results obtained by observing the joining material 3a of the semiconductor device 1 after repeated heat cycles by the use of an ultrasonic flaw detector. An ultrasonic flaw detector irradiates an object to be tested with ultrasonic waves, detects ultrasonic waves reflected from the object to be tested, and checks whether or not there is space in the object to be tested. In FIG. 1C, a position where the metal board 5a of the laminated substrate 6 is disposed is indicated by a dashed line (rectangle) and the joining material 3a is indicated by hatching.

With the semiconductor device 1 the cooling plate 2 differs from the laminated substrate 6, especially from the insulating board 4 in thermal expansivity. Accordingly, heat cycles create thermal stress repeatedly in the joining material 3a between the cooling plate 2 and the laminated substrate 6. As a result, for example, a crack appears or peeling occurs, due to fatigue failure in outer peripheral edge portions of the joining material 3a, especially near corner portions X1 to X4 (elliptical portions enclosed by dashed lines) of the laminated substrate 6. Furthermore, when a heat cycle is repeated, the crack or the peeling goes down to the central portion of the joining material 3a. Accordingly, as can be seen from FIG. 1C, space appears in the outer peripheral edge portions of the joining material 3a, especially near the corner portions X1 to X4 of the laminated substrate 6. When space appears in this way in the joining material 3a due to the crack or the peeling, air flows into the space. If heat is radiated from the laminated substrate 6 through the joining material 3a to the cooling plate 2 and a heat transfer path in the joining material 3a contains air, the thermal resistance of the heat transfer path increases. That is to say, outer peripheral edge portions of the circuit board 5b of the laminated substrate 6, especially the corner portions X1 to X4 of the laminated substrate 6 are inferior in heat radiation property to the central portion of the circuit board 5b.

Therefore, the first semiconductor elements 7 which operate stably at high temperatures are disposed over the outer peripheral edge portions of the circuit board 5b of the laminated substrate 6 whose heat radiation properties are degraded as a result of heat cycles, especially near the corner portions X1 to X4 of the laminated substrate 6. As a result, even if temperature rises due to the operation of the first semiconductor elements 7 and heat radiation is not performed properly, the first semiconductor elements 7 operate stably. Accordingly, the reliability of the semiconductor device 1 after heat cycles is maintained sufficiently.

In such a case, a semiconductor element made of, for example, a silicon semiconductor may be disposed over the central portion of the circuit board 5b of the laminated substrate 6. As a result, heat generated by the semiconductor element made of a silicon semiconductor is radiated from the central portion of the joining material 3a which is not influenced by a crack or the like. Accordingly, efficiency in the cooling of the entire semiconductor device 1 is maintained.

Second Embodiment

In a second embodiment a case where a first semiconductor element made of a wide-band-gap semiconductor and a second semiconductor element made of a silicon semiconductor are disposed over a laminated substrate will be described by the use of FIGS. 2A and 2B.

FIGS. 2A and 2B illustrate a semiconductor device according to a second embodiment.

FIG. 2A is a side view of a semiconductor device 10. FIG. 2B is a top view of the semiconductor device 10.

The semiconductor device 10 includes a cooling plate 11, two laminated substrates 15A and 15B, a plurality of first semiconductor elements 16, and a plurality of second semiconductor elements 17. Repeated descriptions of members having the same names that are used in the first embodiment will be omitted.

Each of the laminated substrates 15A and 15B is formed by laminating a circuit board 14b, an insulating board 13, and a metal board 14a. Furthermore, the circuit board 14b includes a first circuit board 14b1, a second circuit board 14b2, and a third circuit board 14b3. These laminated substrates 15A and 15B are joined with the metal boards 14a therebetween to the same surface of the cooling plate 11 by the use of a conductive joining material 12a.

Each first semiconductor element 16 is a diode element, such as a Schottky barrier diode (SBD), made of silicon carbide. The first semiconductor elements 16 are disposed over the circuit boards 14b (first circuit boards 14b1 and the third circuit boards 14b3 illustrated in FIG. 2B) of the laminated substrates 15A and 15B and are joined by the use of a conductive joining material 12b.

Each second semiconductor element 17 is a switching element, such as an insulated gate bipolar transistor (IGBT) or a power metal oxide semiconductor field effect transistor (MOSFET), made of silicon. The second semiconductor elements 17 are disposed over the circuit boards 14b (first circuit boards 14b1 and the third circuit boards 14b3 illustrated in FIG. 2B) of the laminated substrates 15A and 15B and are joined by the use of a conductive joining material 12c.

Wires (not illustrated) connected to electrodes of the first semiconductor elements 16 and electrodes of the second semiconductor elements 17 are connected to the second circuit boards 14b2.

The area of each first semiconductor element 16 is smaller than that of each second semiconductor element 17. Therefore, the first semiconductor elements 16 whose number is larger than that of the second semiconductor elements 17 are disposed.

In addition, compared with the second semiconductor elements 17 made of silicon, the first semiconductor elements 16 made of silicon carbide are small in loss, operate stably at high temperatures, and have a high withstand voltage. The first semiconductor elements 16 have these characteristics.

With the semiconductor device 10 the cooling plate 11 differs from the laminated substrates 15A and 15B in thermal expansivity. Accordingly, heat cycles create thermal stress repeatedly in the joining material 12a between the cooling plate 11 and the laminated substrates 15A and 15B. As a result, for example, a crack appears or peeling occurs, near each corner portion of the joining material 12a. Furthermore, the crack or the peeling goes down to the central portion of the joining material 12a. This is the same with the first embodiment.

Therefore, the first semiconductor elements 16 which operate stably at high temperatures are disposed over outer peripheral edge portions whose heat radiation properties are degraded as a result of heat cycles, especially near corner portions of the circuit boards 14b. Furthermore, the second semiconductor elements 17 are disposed over central portions of the circuit boards 14b which are not influenced by a crack or the like. As a result, even if temperature rises due to the operation of the first semiconductor elements 16 and heat radiation is not performed properly, the first semiconductor elements operate stably. In addition, because the second semiconductor elements 17 are not influenced by a crack or the like, the second semiconductor elements 17 are cooled properly. Accordingly, the reliability of the semiconductor device 10 after heat cycles is maintained sufficiently. In the second embodiment the outer peripheral edge portions of the circuit board 14b mean outer peripheral edge portions of one circuit board 14b as which all of the first circuit board 14b1, the second circuit board 14b2, and the third circuit board 14b3 are considered. Similarly, the corner portions of the circuit board 14b mean corner portions of one circuit board 14b as which all of the first circuit board 14b1, the second circuit board 14b2, and the third circuit board 14b3 are considered. The reason for this is that a place where a crack or the like appears in the joining material 12a as a result of heat cycles is near an outer peripheral edge portion of one circuit board 14b as which all of the first circuit board 14b1, the second circuit board 14b2, and the third circuit board 14b3 are considered.

The area of each first semiconductor element 16 is smaller than that of each second semiconductor element 17. Therefore, a plurality of first semiconductor elements are disposed reliably over outer peripheral edge portions of the laminated substrates 15A and 15B whose heat radiation properties are degraded. These first semiconductor elements 16 operate stably.

Third Embodiment

In a third embodiment the laminated substrates 15A and 15B are disposed in the semiconductor device 10 according to the second embodiment so that the first semiconductor elements 16 will be over outer portions of the cooling plate 11. This case will be described by the use of FIG. 3.

Figure 3:
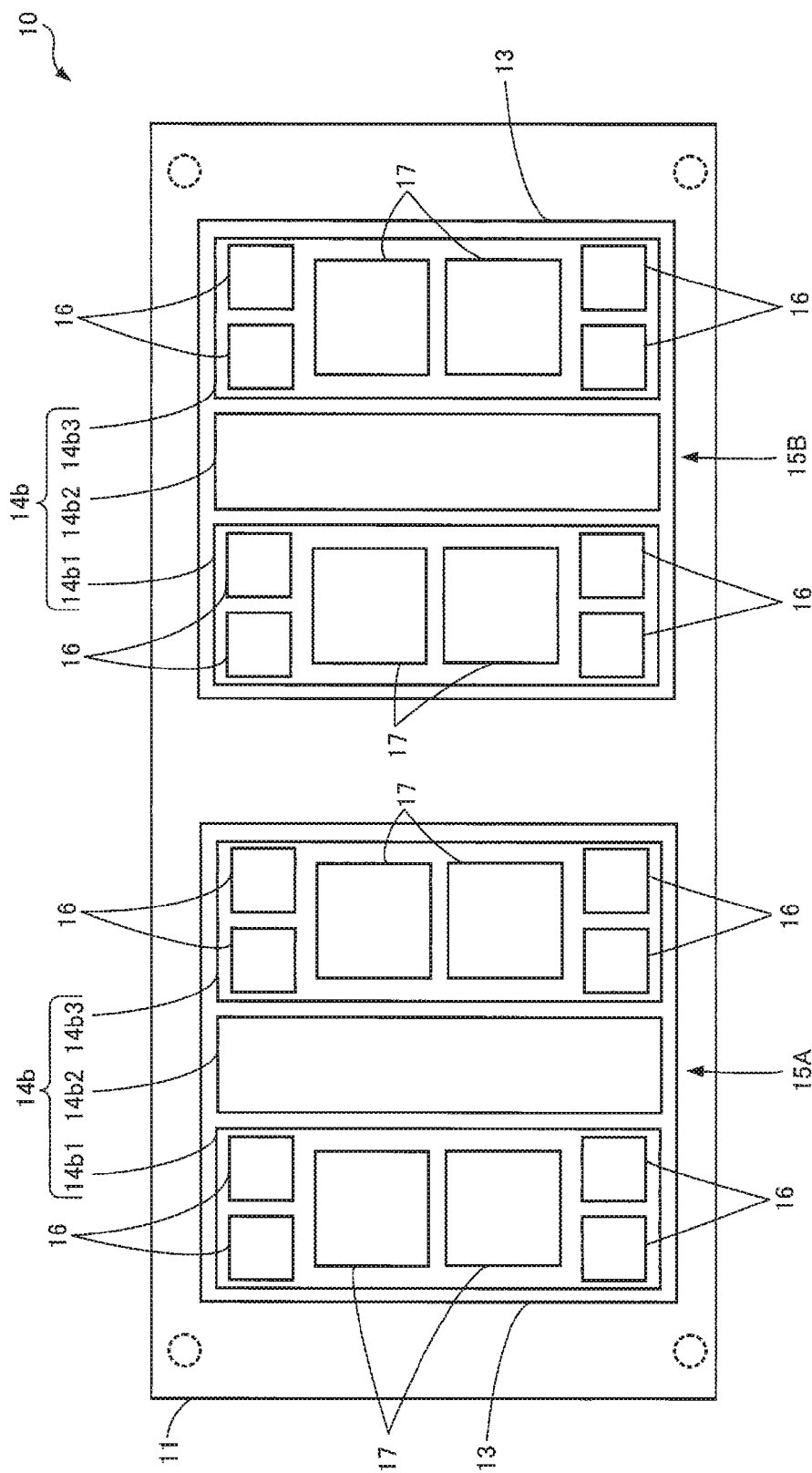
FIG. 3 is a top view which illustrates a semiconductor device according to a third embodiment.

FIG. 3 is a top view which illustrates a semiconductor device according to a third embodiment.

A semiconductor device 10 includes a cooling plate 11, two laminated substrates 15A and 15B, a plurality of first semiconductor elements 16, and a plurality of second semiconductor elements 17. This is the same with the second embodiment.

With the semiconductor device 10 according to the third embodiment each of the laminated substrates 15A and 15B is rotated counterclockwise or clockwise by 90 degrees in the semiconductor device 10 according to the second embodiment so that all of the first semiconductor elements 16 will be over outer portions of the cooling plate 11 (in upper and lower portions of the cooling plate 11 in FIG. 3).

In this case, the first semiconductor elements which operate stably at high temperatures are also disposed over outer peripheral edge portions of the laminated substrates 15A and 15B whose heat radiation properties are degraded as a result of heat cycles, especially near corner portions of the laminated substrates 15A and 15B. Furthermore, the second semiconductor elements 17 are disposed over central portions of the laminated substrates 15A and 15B. By doing so, the reliability of the semiconductor device 10 after heat cycles is maintained sufficiently. This is the same with the second embodiment.

Fourth Embodiment

In a fourth embodiment a case where first semiconductor elements made of a wide-band-gap semiconductor and third semiconductor elements made of a wide-band-gap semiconductor are disposed over laminated substrates will be described by the use of FIGS. 4A and 4B.

FIGS. 4A and 4B illustrate a semiconductor device according to a fourth embodiment.

FIG. 4A is a side view of a semiconductor device 10a.
FIG. 4B is a top view of the semiconductor device 10a.

The semiconductor device 10a includes a cooling plate 11, two laminated substrates 15A and 15B, a plurality of first semiconductor elements 16, and a plurality of third semiconductor elements 18.

As stated above, each first semiconductor element 16 is a diode element, such as a SBD, made of silicon carbide. The first semiconductor elements 16 are disposed over circuit boards 14b (first circuit boards 14b1 and third circuit boards 14b3 illustrated in FIG. 4B) of the laminated substrates 15A and 15B and are joined by the use of a conductive joining material 12b.

Each third semiconductor element 18 is a switching element, such as an IGBT or a power MOSFET, made of silicon carbide. The third semiconductor elements 18 are disposed over the circuit boards 14b (first circuit boards 14b1 and the third circuit boards 14b3 illustrated in FIG. 4B) of the laminated substrates 15A and 15B and are joined by the use of a conductive joining material 12d.

Wires (not illustrated) connected to electrodes of the first semiconductor elements 16 and electrodes of the third semiconductor elements 18 are connected to second circuit boards 14b2.

The first semiconductor elements 16 and the third semiconductor elements 18 are approximately equal in area. The first semiconductor elements 16 and the third semiconductor elements 18 disposed over the circuit boards 14b are equal in number.

Compared with the second semiconductor elements 17 made of silicon, the first semiconductor elements 16 and the third semiconductor elements 18 made of silicon carbide are small in loss, operate stably at high temperatures, and have a high withstand voltage. The first semiconductor elements 16 and the third semiconductor elements 18 have these characteristics.

In addition, if the semiconductor device 10a is used as an inverter, for example, for driving a motor, energy is supplied from the inverter side to the motor side. Compared with the first semiconductor elements 16 (diode elements), at this time the third semiconductor elements 18 (switching elements) are energized for a long time. As a result, the loss of the third semiconductor elements 18 is greater than that of the first semiconductor elements 16 and the temperature of the third semiconductor elements 18 is higher than that of the first semiconductor elements 16.

Furthermore, as stated above, with the semiconductor device 10a the cooling plate 11 differs from the laminated substrates 15A and 15B in thermal expansivity. Accordingly, heat cycles create thermal stress repeatedly in a joining material 12a between the cooling plate 11 and the laminated substrates 15A and 15B. As a result, for example, a crack appears or peeling occurs, near each corner portion of the joining material 12a. Furthermore, the crack or the peeling goes down to the central portion of the joining material 12a.

Therefore, the first semiconductor elements 16 which operate stably at high temperatures are disposed over outer peripheral edge portions of the circuit boards 14b whose heat radiation properties are degraded as a result of heat cycles, especially near corner portions of the circuit boards 14b. Furthermore, the third semiconductor elements 18 which generate more heat than the first semiconductor elements 16 are disposed over central portions of the circuit boards 14b which are not influenced by a crack or the like. As a result, even if temperature rises due to the operation of the first semiconductor elements 16 and heat radiation is not performed properly, the first semiconductor elements 16 operate stably. In addition, because the third semiconductor elements 18 are not influenced by a crack or the like, the third semiconductor elements 18 are cooled properly. Accordingly, the reliability of the semiconductor device 10a after heat cycles is maintained sufficiently.

With the semiconductor device 10a according to the fourth embodiment, each of the laminated substrates 15A and 15B may also be rotated (counterclockwise or clockwise) by 90 degrees with respect to the cooling plate 11 so that all of the first semiconductor elements 16 will be over outer portions of the cooling plate 11. This is the same with the third embodiment.

Furthermore, when regenerative operation in which energy is supplied from the motor side is performed with the semiconductor device 10a as an inverter, the first semiconductor elements 16 (diode elements) are energized for a long time, compared with the third semiconductor elements 18 (switching elements). As a result, the loss of the first semiconductor elements 16 is greater than that of the third semiconductor elements 18.

Accordingly, the third semiconductor elements 18 which operate stably at high temperatures are disposed over outer peripheral edge portions of the laminated substrates 15A and 15B for which it is difficult to radiate heat due to an increase in thermal resistance. Furthermore, the first semiconductor elements 16 whose loss is greater than that of the third semiconductor elements 18 are disposed over central portions of the laminated substrates 15A and 15B for which it is easy to radiate heat. As a result, even if temperature rises due to the operation of the third semiconductor elements 18 and heat radiation is not performed properly, the third semiconductor elements 18 operate stably. In addition, the first semiconductor elements 16 are cooled properly. Accordingly, it is possible to minimize the risks of a decrease in efficiency in the cooling of the semiconductor device 10a and a decrease in the reliability after heat cycles.

Embodiments of the invention have been described in which semiconductor elements or devices having different thermal operability, or different heat operability, properties, are arranged at particular locations on a circuit board of a laminated substrate to maintain optimal performance of the device at high temperatures or after repeated operations.

Embodiments include a semiconductor device including a laminated substrate made up of a circuit board, an insulating board, and a metal board laminated together. A cooling plate is joined to the metal board by a joining material. One or more first semiconductor elements are located at peripheral edges of the circuit board, and the first semiconductor elements may be wide-band-gap semiconductor elements. One or more second semiconductor elements are located closer to the center of the circuit board than the first semiconductor elements. The second semiconductor element may have a narrower band-gap than the first semiconductor element, and the second semiconductor element have a heat operability property inferior to the first semiconductor element.

For example, the heat operability property may be one or more of an ability to operate stably at high temperatures, heat conductivity, or a power loss.

In one embodiment, a thermal conductivity of the cooling plate is different from a thermal conductivity of the laminated substrate, such that the joining material is inclined to acquire cracks after repeated thermal cycles at peripheral edges of the laminated substrate. In such an embodiment, the one or more first semiconductor devices are located in a region of the circuit board corresponding to a region of the joining material prone to acquire cracks.

According to the disclosed technique, the reliability of a semiconductor device is maintained even after a heat cycle is performed repeatedly.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a cooling plate made of metal;
   a laminated substrate formed by laminating a circuit board, an insulating board, and a metal board, the metal board and the cooling plate being joined by using a joining material; and
   four first semiconductor elements and one or more second semiconductor elements, the four first semiconductor elements having more robust heat operability properties than the one or more second semiconductor elements, the four first semiconductor elements being diode elements each made of a wide-band-gap semiconductor and being disposed respectively near four corner portions of the circuit board, the one or more second semiconductor elements being located closer to a center of the circuit board than the four first semiconductor elements and being switching elements,
   wherein the joining material is inclined to acquire cracks after repeated thermal cycles at peripheral edges of the laminated substrate, and the four first semiconductor elements are each located in a region of the circuit board corresponding to a region of the joining material prone to acquire cracks.

2. The semiconductor device according to claim 1, wherein the four first semiconductor elements are disposed over the corner portions of the circuit board.

3. The semiconductor device according to claim 1, wherein the one or more second semiconductor elements are each made of a semiconductor whose band gap is smaller than a band gap of the wide-band-gap semiconductor and are disposed over a central portion of the circuit board.

4. The semiconductor device according to claim 3, wherein:
   the four first semiconductor elements are made of silicon carbide or gallium nitride; and
   the one or more second semiconductor elements are made of silicon.

5. The semiconductor device according to claim 1, wherein:
   the laminated substrate is joined to the cooling plate; and
   the four first semiconductor elements are disposed over outer peripheral edge portions of the circuit board of the laminated substrate.

6. The semiconductor device according to claim 1, wherein:
   the joining material is solder or a sintered metal material;

the cooling plate is made of copper or aluminum;
the circuit board and the metal board are made of copper; and
the insulating board is made of aluminum oxide, aluminum nitride or silicon nitride.

7. The semiconductor device according to claim 1, wherein the one or more second semiconductor elements are each made of a wide-band-gap semiconductor.

8. The semiconductor device according to claim 7, wherein:
the four first semiconductor elements are made of silicon carbide or gallium nitride; and
the one or more second semiconductor elements are made of silicon carbide or gallium nitride.

9. A semiconductor device comprising:
a laminated substrate made up of a circuit board, an insulating board, and a metal board laminated together;
a cooling plate joined to the metal board by a joining material;
four first semiconductor elements, the four first semiconductor elements being wide-band-gap semiconductor elements and being disposed respectively near four corner portions of the circuit board; and
at least one second semiconductor element, the at least one second semiconductor element having a narrower band-gap than the four first semiconductor elements, the at least one second semiconductor element having a heat operability property inferior to the four first semiconductor elements, and the at least one second semiconductor element being located closer to a center of the circuit board than the four first semiconductor elements,
wherein the joining material is inclined to acquire cracks after repeated thermal cycles at peripheral edges of the laminated substrate, and the four first semiconductor elements are each located in a region of the circuit board corresponding to a region of the joining material prone to acquire cracks.

10. The semiconductor device of claim 9, wherein the heat operability property is an ability to operate stably at high temperatures.

11. The semiconductor device of claim 9, wherein the heat operability property is heat conductivity, such that each of the four first semiconductor elements has better heat conductivity than the at least one second semiconductor element.

12. The semiconductor device of claim 9, wherein each of the four first semiconductor elements has lower power loss than the at least one second semiconductor element.

13. The semiconductor device of claim 9, wherein a thermal conductivity of the cooling plate is different from a thermal conductivity of the laminated substrate.

14. The semiconductor device according to claim 9, wherein:
the four first semiconductor elements are diode elements made of silicon carbide or gallium nitride;
the at least one second semiconductor element is a switching element made of silicon;
the joining material is solder or a sintered metal material;
the cooling plate is made of copper or aluminum;
the circuit board and the metal board are made of copper; and
the insulating board is made of aluminum oxide, aluminum nitride or silicon nitride.

* * * * *